United States Patent
Putzeys

[19]

[11] Patent Number: 6,046,636
[45] Date of Patent: Apr. 4, 2000

[54] DEVICE FOR AMPLIFYING SIGNALS

[75] Inventor: Bruno J. G. Putzeys, Leuven, Belgium

[73] Assignee: U.S. Philips Corporation, New York, N.Y.

[21] Appl. No.: 09/112,887

[22] Filed: Jul. 9, 1998

[30] Foreign Application Priority Data

Jul. 11, 1997 [EP] European Pat. Off. .............. 97202164

[51] Int. Cl.[7] ................................ H03F 1/26; H03F 3/68; H03F 21/00
[52] U.S. Cl. .................. 330/149; 330/124 R; 330/207 A
[58] Field of Search ............................ 330/124 R, 207 A, 330/251, 295, 149

[56] References Cited

U.S. PATENT DOCUMENTS 5,398,003 3/1995 Heyl et al. ............................... 330/251

FOREIGN PATENT DOCUMENTS 265604 10/1989 Japan .
2134735A 8/1984 United Kingdom .

*Primary Examiner*—Benny Lee
*Assistant Examiner*—Patricia T. Nguyen
*Attorney, Agent, or Firm*—Steven R. Biren

[57] ABSTRACT

A device for amplifying signals comprising at least two amplifier circuits (20, 30, 40, 50) as well as means for precluding interference between the amplifier circuits (20, 30, 40, 50). The amplifier circuit (20, 30, 40, 50) is provided with at least first and second modules (109, 110, 112) which are arranged in cascade, each module (109, 110, 112) being provided with an earth point (i, c, p). The means for precluding interference comprise at least one global earth point (60) and a number of earth connections (70, 80, 90) between the earth points (i, c, p) of corresponding modules (109, 110, 112). The global earth point (60) is connected to the individual earth connections (70, 80, 90).

4 Claims, 2 Drawing Sheets

DEVICE FOR AMPLIFYING SIGNALS

BACKGROUND OF THE INVENTION

The invention relates to a device for amplifying signals comprising at least two amplifier circuits, which device also includes means for precluding interference between the amplifier circuits.

Such a device is known from GB-A 2 134 735. It is known that the amplifier circuits incorporated in such a device may influence each other. This influence, also referred to as interference, may lead to undesirable disturbances in the signals amplified by the amplifier circuits. Interference may occur, for example, if two amplifier circuits are operated at different frequencies. As a result, interference signals may be generated in the amplifier circuits, the frequencies of said interference signals being equal to the sum of or the difference between the original frequencies. Interference may also occur if the amplifier circuits are embodied so as to be switching amplifiers. In this case, switching of a first amplifier may cause a switching action in a second amplifier.

The device known from said English patent application comprises first and second pulse-width modulating amplifier circuits, which both include a comparator and a switching amplifier connected thereto. In these amplifier circuits, an input signal to be amplified is converted into a pulse-width modulated square-wave switching signal by comparing the input signal in the comparator to a triangular reference signal. The switching signal is subsequently amplified by the switching amplifier.

In the known device, interference between the two amplifier circuits as a result of the simultaneous switching of the switching amplifiers is precluded by employing reference signals having different phase. A first reference signal is generated by an oscillator and supplied to the first amplifier circuit. A second reference signal is derived from this first reference signal in a phase shifter, the phase of said second reference signal being shifted ninety degrees relative to the first reference signal. This second reference signal is supplied to the second amplifier circuit. As the phases of the reference signals are different, the phases of the switching signals are different too. By virtue thereof, the switching amplifiers cannot be switched simultaneously.

The known device comprises relatively many parts, so that the device is relatively complicated and expensive.

SUMMARY OF THE INVENTION

It is an object of the invention to provide a device of the type mentioned in the opening paragraph, which is relatively simple and inexpensive. To achieve this, the device in accordance with the invention is characterized in that the amplifier circuit is provided with at least a first and a second module which are arranged in cascade, each module being provided with an earth point, and the means comprising earth connections between the earth points of corresponding modules, and said means also including at least one global earth point which is connected to the individual earth connections.

Amplifier circuits generally comprise modules having a different current requirement. In general, an output stage will draw substantially more current than a control stage or an input stage. In addition, modules having a relatively low current requirement are generally more sensitive to interference voltages than modules having a relatively high current requirement. If two such modules having different current requirements are coupled to the same local earth point, it is possible that, owing to the development of interference voltages, an earth current of the module with the greatest current requirement affects the operation of the module with the smallest current requirement. This is precluded by decoupling the earth currents of these modules in the manner proposed above. It has been found that, in this manner, undesirable interferences between the amplifier circuits can be substantially suppressed.

The device in accordance with the invention has the additional advantage that self-oscillating amplifier circuits can be used in said device. An oscillator is superfluous, so that the device comprises even fewer components. In the known device, self-oscillating amplifier circuits cannot be used as the method employed to avoid interference only has the desired effect if it can be guaranteed that the phases of the switching signals are different.

An embodiment of the device in accordance with the invention is characterized in that the modules succeeding the first module have a high input impedance. As a result, only small currents can flow between the modules. By virtue thereof, it is precluded that successive modules influence each other as a result of the formation of undesirable interference voltages on the earth connections. It is noted that the first module may also have a high input impedance. However, this is not important for the influence exerted by the modules on one another.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

EXAMPLE

Figure 1:
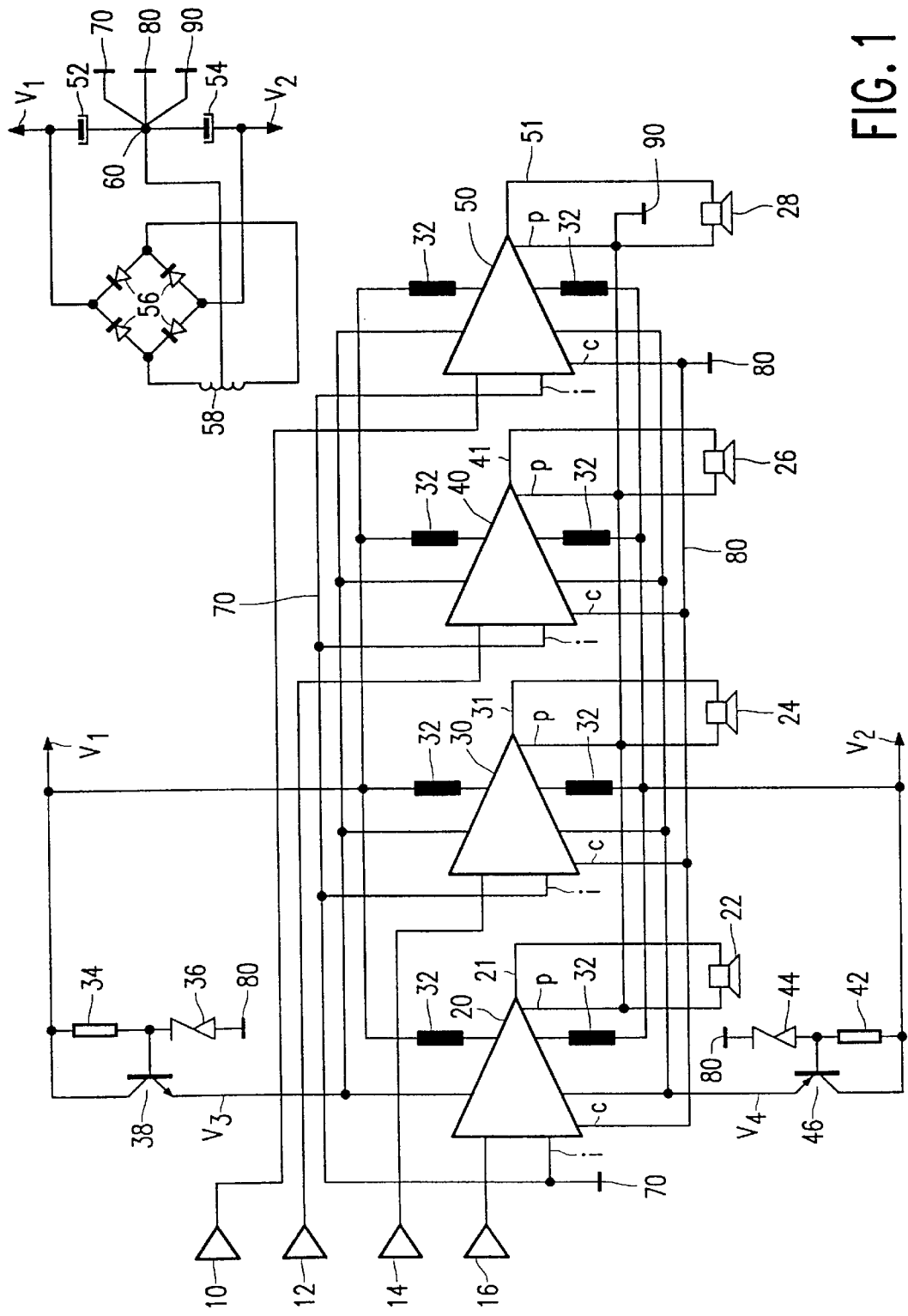
FIG. 1 shows an electrical diagram of an example of a device in accordance with the invention.

The device shown in FIG. 1 is intended especially for amplifying audio signals. To this end, the device comprises four identical amplifier circuits 20, 30, 40 and 50. Audio signals fed to the inputs 16, 14, 12 and 10, respectively, of said amplifier circuits are amplified by these amplifier circuits 20, 30, 40 and 50, and supplied to the loudspeakers 22, 24, 26 and 28 via the outputs 21, 31, 41 and 51 of said circuits.

Figure 2:
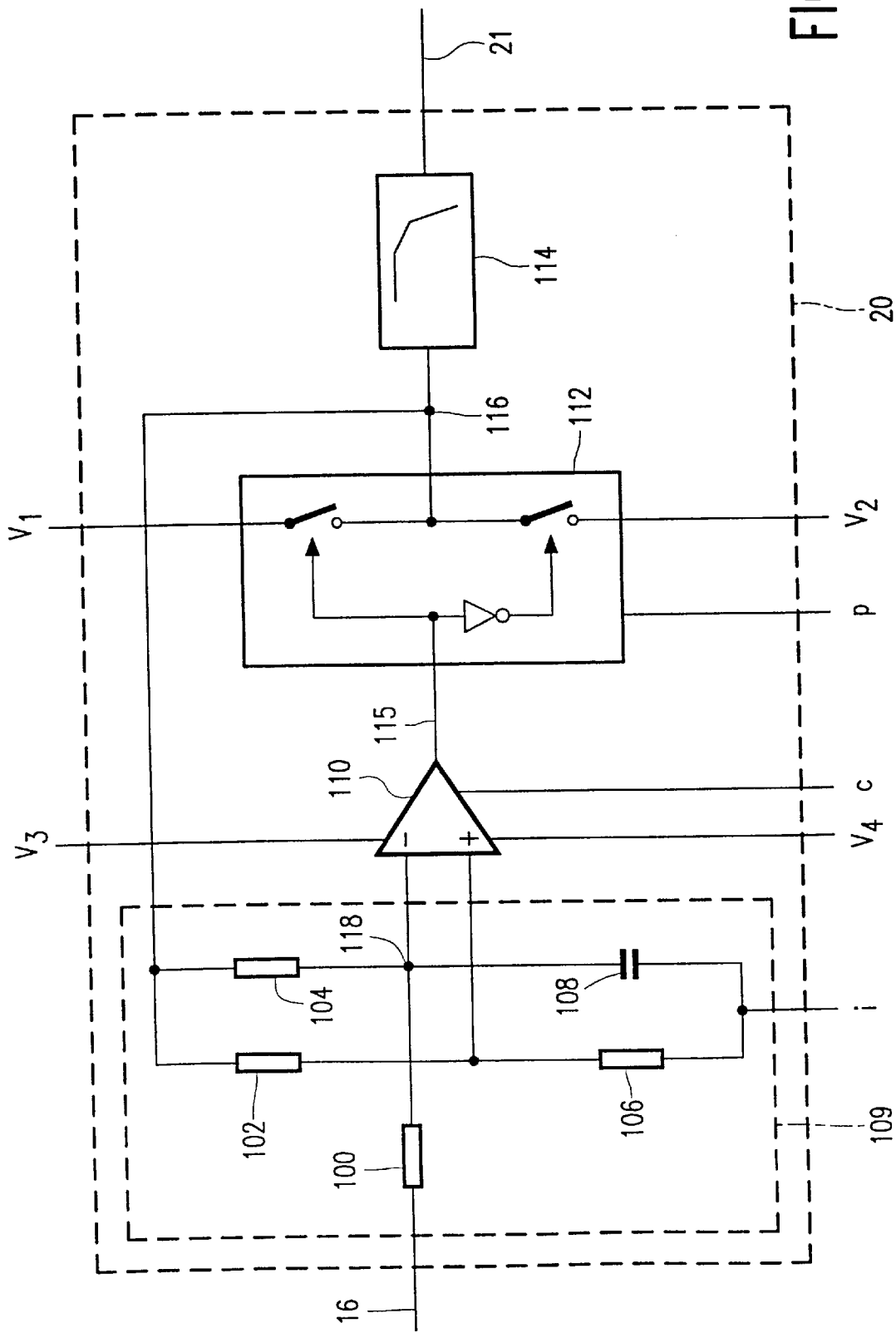
FIG. 2 shows a block diagram of an amplifier circuit for use in a device in accordance with the invention.

As will be shown in FIG. 2, the amplifier circuits 20, 30, 40 and 50 comprise three cascade-arranged modules. These modules are an input stage, a comparator and an output stage. All input stages of the amplifier circuits 20, 30, 40 and 50 have an earth point i. Similarly, all comparators have an earth point c and all output stages have an earth point p. All earth points i of the amplifier circuits 20, 30, 40 and 50 are interconnected via an earth connection 70. Similarly, all earth points c are interconnected via an earth connection 80, and all earth points p are interconnected via an earth connection 90. These earth connections 70, 80 and 90 are individually connected to a global earth point 60.

In a symmetrical power supply which forms part of the device, a positive supply voltage $V_1$ and a negative supply voltage $V_2$ are generated for the amplifier circuits 20, 30, 40 and 50. In this case, the power supply comprises a transformer 58 (of which only a single coil is shown) and a bridge rectifier which is coupled thereto and which is formed by four diodes 56. As the global earth point 60 is connected to the center tap of the transformer 58, and $V_1$ and $V_2$ are each connected to an output of the bridge rectifier, it applies that $V_1$ is equal to $-V_2$. The electrolytic capacitors 52 and 54 smooth the supply voltages $V_1$ and $V_2$ in known manner.

A supply voltage $V_3$ is derived from the supply voltage $V_1$ via a resistor 34, a zener diode 36 and a transistor 38. Similarly, a supply voltage $V_4$ is derived from the supply voltage $V_2$ via a resistor 42, a zener diode 44 and a transistor 46. By means of the supply voltages $V_1$ and $V_2$, the output stages in the amplifier circuits 20, 30, 40 and 50 are fed via decoupling coils 32. The supply voltages $V_3$ and $V_4$ are used to feed the comparators in the amplifier circuits 20, 30, 40 and 50.

FIG. 2 shows a block diagram of the amplifier circuit 20. The construction of the other amplifier circuits 30, 40 and 50 is identical to that of said amplifier circuit 20. The amplifier circuit 20 comprises an input stage 109, a comparator 110, an output stage 112 and a low-pass filter 114. These modules are arranged in cascade in the above-mentioned order.

The comparator 110 and the output stage 112 have a high input impedance, so that only small currents can flow between, on the one hand, the input stage 109 and the comparator 110 and, on the other hand, the comparator 110 and the output stage 112. By virtue thereof, the influence exerted by the comparator 110 on the input stage 109 and by the output stage 112 on the comparator 110 is precluded since undesirable interference voltages on the earth connections occur only to a limited degree.

The input stage 109 is formed by the resistors 100, 102, 104 and 106 in combination with the capacitor 108. This input stage 109 can be earthed via an earth point i. The comparator 110 can be fed via the connections $V_3$ and $V_4$. Moreover, the comparator 110 can be earthed via an earth point c. The output stage 112 can be fed via the connections $V_1$ and $V_2$. The output stage 112 can be earthed via an earth point p.

The combination of an input stage 109, a comparator 110 and an output stage 112, as shown in the drawing, forms a self-oscillating, switching amplifier (self-oscillating class D-amplifier). A low-frequency audio signal which is supplied to an input 16 is modulated on a high-frequency square wave by said combination of input stage 109, comparator 110 and output stage 112. The resultant pulse-width modulated square wave formed at an output 115 of the comparator 110 is amplified by the output stage 112, whereafter the high-frequency component of the signal is removed in the low-pass filter 114. In this example, the output stage 112 is embodied so as to be a switching amplifier, enabling, for example, MOSFETs to be used as switching elements. To achieve a high input impedance of the output stage 112, it is possible to provide the output stage 112 with a buffer amplifier at an input 115.

As in such a switching amplifier power dissipation hardly occurs, the efficiency of the proposed amplifier circuit 20 is very high. By feeding back the amplified pulse-width modulated square wave to the comparator 110, a self-oscillating system is obtained in which variations in the supply voltages $V_1$ and $V_2$ are very substantially compensated for. For further details reference is made to a description of such an amplifier in the magazine "Elektor" (September 1979, pp. 46 through 48).

What is claimed is:

1. A device for amplifying signals comprising at least two amplifier circuits (20, 30, 40, 50), which device also includes means for precluding interference between the amplifier circuits (20, 30, 40, 50), characterized in that the amplifier circuit (20, 30, 40, 50) is provided with at least a first and a second module (109, 110, 112) which are arranged in cascade, each module (109, 110, 112) being provided with an earth point (i, c, p), and the means comprising earth connections (70, 80, 90) between the earth points (i, c, p) of corresponding modules (109, 110, 112), and said means also including at least one global earth point (60) which is connected to the individual earth connections (70, 80, 90).

2. A device as claimed in claim 1, characterized in that the amplifier circuit (20, 30, 40, 50) comprises a self-oscillating switching amplifier.

3. A device as claimed in claim 1, characterized in that the modules comprise an input stage (109), a comparator (110) and an output stage (112).

4. A device as claimed in claim 1, characterized in that the modules (110, 112) succeeding the first module (109) have a high input impedance.

* * * * *